(12) United States Patent
Thielman et al.

(10) Patent No.: US 6,908,295 B2
(45) Date of Patent: Jun. 21, 2005

(54) PROCESS AND APPARATUS FOR EMBOSSING PRECISE MICROSTRUCTURES AND EMBOSSING TOOL FOR MAKING SAME

(75) Inventors: W. Scott Thielman, Palatine, IL (US); Robert M. Pricone, Libertyville, IL (US)

(73) Assignee: Avery Dennison Corporation, Pasadena, CA (US)

( * ) Notice: Subject to any disclaimer, the term of this patent is extended or adjusted under 35 U.S.C. 154(b) by 186 days.

(21) Appl. No.: 10/015,319

(22) Filed: Dec. 12, 2001

(65) Prior Publication Data

US 2003/0102591 A1 Jun. 5, 2003

(Under 37 CFR 1.47)

Related U.S. Application Data

(63) Continuation-in-part of application No. 09/596,240, filed on Jun. 16, 2000, now abandoned, and a continuation-in-part of application No. 09/781,756, filed on Feb. 12, 2001, now abandoned.

(51) Int. Cl.[7] .......................... B29C 43/48; B29C 43/52
(52) U.S. Cl. ..................... 425/371; 425/384; 425/385
(58) Field of Search ............................. 425/371, 384, 425/385

(56) References Cited

U.S. PATENT DOCUMENTS

| | | | |
|---|---|---|---|
| 3,223,027 A | * 12/1965 | Soda et al. ............ 425/371 |
| 3,728,066 A | 4/1973 | Stadler et al. | |
| 3,901,639 A | 8/1975 | Mandelson et al. | |
| 4,193,342 A | 3/1980 | Held | |
| 4,253,391 A | 3/1981 | Held | |
| 4,283,246 A | 8/1981 | Held | |
| 4,285,525 A | 8/1981 | Held | |
| 4,299,551 A | 11/1981 | Held | |
| 4,332,847 A | 6/1982 | Rowland | |
| 4,396,566 A | 8/1983 | Brinkman et al. | |
| 4,435,104 A | 3/1984 | Held | |
| 4,466,847 A | 8/1984 | Held | |
| 4,467,718 A | 8/1984 | Held | |
| 4,478,769 A | 10/1984 | Pricone et al. | |
| 4,485,733 A | 12/1984 | Held | |
| 4,486,363 A | 12/1984 | Pricone et al. | |
| 4,494,648 A | 1/1985 | Held | |
| 4,526,737 A | 7/1985 | Held | |
| 4,537,810 A | 8/1985 | Held | |
| 4,541,889 A | 9/1985 | Held | |
| 4,548,133 A | 10/1985 | Held | |
| 4,557,778 A | 12/1985 | Held | |
| 4,573,404 A | 3/1986 | Held | |
| 4,579,612 A | 4/1986 | Held | |
| 4,589,948 A | 5/1986 | Held | |
| 4,599,940 A | 7/1986 | Held | |
| 4,601,861 A | 7/1986 | Pricone et al. | |
| 4,615,758 A | 10/1986 | Held | |
| 4,665,818 A | 5/1987 | Held | |

(Continued)

Primary Examiner—James P. Mackey
(74) Attorney, Agent, or Firm—Renner, Otto, Boisselle & Sklar, LLP (57) ABSTRACT

A process and apparatus for embossing thermoplastic products having precise microstructured surfaces including using a continuous press having upper and lower belts with the embossing pattern(s); feeding thermoplastic material through the press where heat and pressure are applied to form the embossed pressure microstructure, and cooling the embossed material, all while maintaining pressure. A continuous embossing tool is provided by welding segments together, the welds including interface material at the weld joint which is of a different material than the segment material to increase the tensile strength.

48 Claims, 6 Drawing Sheets

U.S. PATENT DOCUMENTS

| | | |
|---|---|---|
| 4,693,859 A | 9/1987 | Held |
| 4,699,676 A | 10/1987 | Held |
| 4,711,168 A | 12/1987 | Held |
| 4,723,484 A | 2/1988 | Held |
| 4,771,683 A | 9/1988 | Schermutzki |
| 4,778,373 A | 10/1988 | Held |
| 4,802,837 A | 2/1989 | Held |
| 4,816,114 A | 3/1989 | Held |
| 4,826,560 A | 5/1989 | Held |
| 4,844,766 A | 7/1989 | Held |
| 4,921,569 A | 5/1990 | Held |
| 4,988,478 A | 1/1991 | Held |
| 5,038,593 A | 8/1991 | Pankoke |
| 5,087,319 A | 2/1992 | Held |
| 5,094,308 A | 3/1992 | DeBrock |
| 5,098,514 A | 3/1992 | Held |
| 5,125,812 A | 6/1992 | Held |
| 5,141,583 A | 8/1992 | Held |
| 5,149,394 A | 9/1992 | Held |
| 5,167,781 A | 12/1992 | Kemerer et al. |
| 5,211,899 A | 5/1993 | Fujii |
| 5,213,872 A | 5/1993 | Pricone et al. |
| 5,272,967 A | 12/1993 | Held |
| 5,303,644 A | 4/1994 | Held |
| 5,330,595 A | 7/1994 | Held |
| 5,335,592 A | 8/1994 | Rottger |
| 5,351,877 A | 10/1994 | Rottger |
| 5,352,321 A | 10/1994 | Held |
| 5,460,764 A | 10/1995 | Held |
| 5,558,016 A | 9/1996 | DeBrock |
| 5,601,015 A | 2/1997 | Rottger et al. |
| 5,695,599 A | 12/1997 | Pankoke |
| 5,711,838 A | 1/1998 | Pankoke |
| 5,713,271 A | 2/1998 | DeBrock |
| 5,783,856 A | 7/1998 | Smith et al. |
| 5,958,309 A | 9/1999 | Fujii et al. |
| 6,009,803 A | 1/2000 | Pankoke et al. |
| 6,015,214 A | 1/2000 | Heenan et al. |
| 6,238,538 B1 | 5/2001 | Parce et al. |
| 6,274,508 B1 | 8/2001 | Jacobsen et al. |

* cited by examiner

PROCESS AND APPARATUS FOR EMBOSSING PRECISE MICROSTRUCTURES AND EMBOSSING TOOL FOR MAKING SAME

RELATED APPLICATIONS

This application is a continuation-in-part of U.S. application Ser. No. 09/596,240 filed Jun. 16, 2000, now abandoned, and Ser. No. 09/781,756, filed Feb. 12, 2001, now abandoned, commonly assigned to applicant's assignee, the disclosure and subject matter of each of which is incorporated in full herein by reference.

BACKGROUND OF THE INVENTION

1. Technical Field

The present invention relates to a process and apparatus for embossing material with precise detail, and more particularly, to a process and apparatus for making products of thermoplastic material having surfaces with precision microstructures, as defined below. It also pertains to a tool and method of making a tool for such embossing.

2. Background Art

Processes and apparatus for embossing precision optical patterns such as microcubes, in a resinous sheet or laminate, is well known as referenced in U.S. Pat. Nos. 4,486,363; 4,478,769; 4,601,861; 5,213,872; and 6,015,214, which patents are all incorporated herein by reference. In the production of such synthetic resin optical sheeting, highly precise embossing (generally exceeding the capabilities of the current micromolding processing techniques for synthetic resins), is required because the geometric accuracy of the optical elements determines its optical performance. The above referenced patents disclose in particular methods and apparatus for continuously embossing a repeating retroreflective pattern of fine or precise detail on one surface of a transparent thermoplastic material film to form the surface of the film into the desired microstructure pattern.

Besides precision optical sheeting, various other applications have been developed requiring the formation of highly precise shapes and structures in resinous film. Such applications include (in addition to optical applications) microfluidic, micro-electrical, micro-acoustic, and micro-mechanical applications. Such applications require the embossing of thermoplastic material to provide precisely formed functional geometric elements, or arrays of such functional geometric elements on the film surface.

These geometric elements, or precision microstructures, are defined by any or all of the following characteristics: precise embossing depths; flat surfaces with precise angular orientation; fine surface smoothness; sharp angular features with a very small radius of curvature; and precise dimensions of the elements and/or precise separation of the elements, within the plane of the film. The precise nature of the formed surface is critical to the functional attributes of the formed products, whether used for microcubes or other optical features; or as channels for microfluidics, or in fuel cells; or for accurate dimensions, flatness and spacing when providing a surface for holding nanoblocks in Fluidic Self Assembly (FSI) techniques; or imparting a microtextured surface that is not optically smooth within an array that includes, or excludes additional microarchitecture.

U.S. patents describing some uses of precise microstructures include: U.S. Pat. Nos. 4,486,363; 6,015,214 (microcubes); U.S. Pat. Nos. 5,783,856; 6,238,538 (microfluidics); and U.S. Pat. No. 6,274,508 (FSA).

As described in some of the above mentioned patents, such as U.S. Pat. Nos. 4,486,363, 4,601,861, and 4,478,769, embossed microstructure film may be made on a machine that includes two supply reels, one containing an unprocessed film of thermoplastic material, such as acrylic or polycarbonate, or even vinyl, and the other containing a transparent and optically smooth plastic carrier film such as Mylar, which should not melt or degrade during the embossing process. These films are fed to and pressed against a heated embossing tool which may take the form of a thin endless flexible metal belt. The belt creates the desired embossed pattern on one surface of the thermoplastic film, and the carrier film makes the other surface of the thermoplastic film optically smooth.

The belt moves around two rollers which advance the belt at a predetermined linear controlled speed or rate. One of the rollers is heated and the other roller is cooled. An additional cooling station, e.g. one that blows cool air, may be provided between the two rollers. Pressure rollers are arranged about a portion of the circumference of the heated roller. Embossing occurs on the web as it and the tool pass around the heated roller and while pressure is applied by one or more pressure rollers causing the film to be melted and pressed onto the tool. The embossed film, (which may have been laminated to other films during the embossing process), is cooled, monitored for quality and then moved to a storage winder. At some point in the process, the Mylar film may be stripped away from the embossed film.

The prior apparatus and process work well to produce rolls of film that are effectively 48" (122 cm) wide (52"/132 cm at salvage), but such equipment and processes have several inherent disadvantages. First, the process speed (and thus the volume of material) is limited by the time needed to heat, mold and freeze the film. Also, the pressure surface area and thus the time available to provide adequate pressure by the pressure rollers, impose certain special constraints; and then cooling the material. Finally the formation of some embossed surfaces while the tool is in a curved condition requires complex modification of the geometry of the tool surface, because the thermoplastic elements are formed while on a curved surface but generally used later while on a flat surface.

One earlier prior device for forming microcubes while in a planar condition is illustrated in U.S. Pat. No. 4,332,847, and involves indexing of small (9"×9" or 22.86 cm×22.86 cm) individual molds at a relatively slow speed (See Col. 11, lines 31–68). That process is not commercially practical because of its perceived inability to accurately reproduce microstructures because of indexing mold movement and the relatively small volume (caused by mold size) and speed. Also, the equipment and process is non-continuous.

It is apparent that there is a need for equipment and processes that permit a larger volume of precision microstructure material to be produced in a given time, and using tools that may heat, emboss and cool the film while in a planar condition.

Continuous press machines have been used in certain industries and provide some of these features, but to applicants' knowledge, had not previously been modified nor used to produce previous microstructures. These machines include double band presses which have continuous flat beds with two endless bands or belts, usually steel, running above and below the product and around pairs of upper and lower drums or rollers. An advantage of such presses is the mainly uniform pressure which can be provided over a large area. These machines form a pressure or reaction zone between the two belts and have the advantage that pressure is applied to a product when it is flat rather than when it is curved. The double band press also allows pressure to be adjusted over a wide range and the same is true of temperature variability. Dwell time or time under pressure also is controllable for a given press by varying the production speed or rate, as is capacity, which may be changed by varying speed and/or length and/or width of the press. The bands may have highly smooth surfaces, or alternatively may in some cases have macrostructured surfaces for forming desired structure in the product passing through the press. However, such presses, without modifications, are neither designed for nor capable of embossing precise microstructures on the material passing through the press.

In use, the product raw material is fed between the two belts and drawn into the press at a constant speed. The belts heat and press the material in a direction that is normal to its motion, in a relatively long flat plane. Of course, friction is substantial on the product, and double band presses overcome this by several systems. One system is the gliding press, where pressure-heating plates are covered with low-friction material such as polytetrafluoroethylene and lubricating oil. Another is the roller bed press, where rollers are placed between the stationary and moving parts of the press. The roller press is sometimes associated with the term "isochoric".

The third type of press is the fluid or air cushion press, which uses a fluid cushion of oil or air to reduce friction between the belt and the rest of the machine. It was conceived by applicants that this type of press may be suitable for precision embossing of microstructures. The fluid cushion press is sometimes associated with the term "isobaric." Isobaric presses currently available may operate to about 1000 psi (6.89 MPa), and at temperatures up to 662° F. (350° C.). Air has the advantage of providing a more uniform pressure distribution over the entire width and length of the press in the reaction zone. With either thick or thin raw material, or substrate, heat is transferred from heated pressure plates to the belts and then to the film or substrate.

In an isobaric press, heat generally does not come from rollers or drums; rather the fluid, e.g. air, provides it. The fluid transfers heat to the steel belts which in turn transfer the heat to the material pressing through the press. This provides one advantage over prior art forms of embossing equipment—the ability to heat the film to be embossed from both sides.

Another advantage of the double band press is that the raw material may be heated first and then cooled, while the product is maintained under pressure. Heating and cooling elements may be separately located one after the other in line behind the belts. The steel press belts are first heated and then cooled, thereby efficiently heating and then cooling the material in the reaction zone and all while under pressure.

Continuous press machines fitting the general description provided hereinabove are sold by Hymmen GmbH of Bielefeld, Germany (U.S. office: Hymmen International, Inc. of Duluth, Ga.) as models ISR and HPL. These are double belt presses and also appear under such trademarks as ISOPRESS and ISOROLL. Typically they have been used to produce relatively thick laminates, primarily for the furniture industry.

U.S. Pat. No. 4,844,766 to Kurt Held discloses a double band pressure embossing press for fabrication of thermoplastic webs from thermoplastic resinous material heated to a processing temperature. The '766 patent discloses that the thermoplastic webs may be smoothed and calibrated, and may be provided with relatively coarse surface structures such as knobs, ornaments, corrugations, etc. by providing the press band with structured surfaces. The thermoplastic web first passes through a heated zone on the press, then a cooling zone at which smoothing of the web surface is terminated. However, the '766 patent does not disclose a method or apparatus for providing thermoplastic webs with precision microstructured features, as achieved by the present invention. Moreover, neither the Hymmen presses nor the Held patent disclose several other important aspects of embodiments of the invention which are related to the the embossing tool. Preferably, the embossing tool will be made of a different material than the steel belts heretofore used, thus allowing for ease in the manufacture of precision microstructure features.

Even though double band relatively coarse embossing of thermoplastic materials is known ("course" to the point that structures produced are not essential for the products performance), in the prior processes the geometric tolerance from the embossing belt or tool to the film was not critical for overall product performance. Significant improvements are still needed to increase manufacturing precision and efficiency, improve quality and lower the cost of producing finished products.

Thus an object of the present invention is to provide a process and apparatus for efficiently, effectively, and inexpensively embossing thermoplastic material with precise microstructure detail.

OBJECTS OF THE INVENTION

It is a primary object of the invention to provide a process for forming thermoplastic products having precision microstructured surfaces, comprising the steps of: providing a continuous press having opposed parallel continuous bands having upper and lower press surfaces defining a relatively flat reaction zone therebetween; at least one of such press bands being provided with an inverse topography of the precision microstructure surface to be formed; continuously feeding a thermoplastic film material through the reaction zone and causing the film material to be heated to its embossing temperature $T_e$ while applying pressure to at least one press surface to form the precise microstructure surface as it moves through the reaction zone; and moving the embossed material to an adjacent area of the reaction zone and cooling the embossed film while concurrently maintaining pressure on it.

Another object of invention is to provide an apparatus for continuously forming thermoplastic products having precision microstructured surfaces thereon, comprising a continuous double band press having spaced upper and lower primary bands, at least one of the bands being provided with a tool surface having the inverse topography of the precision microstructured surface to be formed. Means are provided for continuously feeding a thermoplastic material through the press and between the bands. Heating means are provided for heating the material to its embossing temperature $T_e$; as are pressure means for applying sufficient pressure to the belts to cause the precise engagement of the heated thermoplastic material with the belts and the tool surface to emboss the material with the precise microstructured pattern. The apparatus has cooling means for cooling the material while maintaining pressure on the material while it is cooled, and while the material is moving through the press.

Another object of the invention is to provide a method of making an embossing tool for forming precise microstructure articles, comprising the steps of: providing a substantially planar tool of a first material, the tool having first and second opposite ends; providing a patterned side and a back side opposite the patterned side on the tool; placing the opposite ends together so that the unpatterned side faces inwardly; providing an interfacing material between the opposite ends, the interface material being of a different material then the planar tool material; and laser welding the opposite ends together via the interface material so that the opposing ends of the tool are fixedly joined and a continuous tool is formed.

Yet another object of the invention is to provide a method of making a continuous flexible embossing tool for use in a continuous double band press, comprising the steps of: assembling at least two segments of tooling each of a first composition and each segment having one end positioned opposite one end of the adjacent segment; each segment having a patterned side and a back side which when assembled, provide the patterned sides oriented in the same direction; placing the opposing segment ends together and welding the ends together utilizing an interface material formed of a different material than the material of the segments, such that the opposing ends of the segments are joined.

Another principle object of the invention is to provide a flexible endless metal belt for embossing precision microstructures, the belt having an outer surface provided with a topography which is the inverse of the precision microstructure product to be embossed thereby; the belt being formed of a first material and having at least one weld extending across the width thereof, the weld comprising a second interface material which is of a material different than the first material of which the belt is composed.

As noted, the present invention offers numerous advantages and relates to a process and apparatus for making thermoplastic products having precision microstructured patterns comprising the steps of providing a continuous press with an upper set of rollers, a lower set of rollers, an upper belt disposed about the upper set of rollers, a lower belt disposed about the lower set of rollers, the upper and lower belts defining a relatively flat reaction zone therebetween, the reaction zone including a heating station, a cooling station and pressure producing means; feeding a thermoplastic film between the bands and through the reaction zone; heating the material to an embossing temperature $T_e$ above the glass transition temperature $T_g$ of the thermoplastic material, (e.g. around 100° to 150° F./38° C. to 66° C. above $T_g$); applying on elevated embossing pressure to the material, (e.g. about 250 psi/1.7 MPa); cooling the material (e.g. well below $T_g$); while maintaining the elevated pressure on the material.

The present invention adapts a known type of continuous machine press, known as an isobaric double band continuous press, to the embossing of precision microstructured thermoplastic material. As noted, one well-known type of precision microstructured sheeting is optical sheeting. Flatness and angular accuracy are important in precision optical sheeting including, for example, cube corner retroreflective films for road reflectors or signage, and Fresnel lenses incorporating catadioptrics.

Besides precision optical sheeting, various other applications have been developed requiring the formation of highly precise shapes and structures in resinous optical film. In particular the invention permits the embossing of thermoplastic material to provide precision microstructures comprising microscopic embossed elements of elements, or arrays of microscopic recessed and/or raised embossed element having applications to optical, micro-fluidic, micro-electrical, micro-acoustic, and/or micro-mechanical fields.

As used in the present application, "precision microstructured" material generally refers to a thin film or sheet of resinous thermoplastic material having an embossed precise geometric pattern of very small elements or shapes, and in which the precision of the formation is essential to functionality of the product. In this instance the precision of the embossed film is a function of both the precise geometry required of the product, and the capability of the embossing tool, process and apparatus to conserve the geometric integrity from tool to article.

Typically at least one or more of the following features will be formed in the film, (on one or both sides thereof):

(a) flat surfaces with angular slopes controlled to a tolerance of 5 minutes relative to a reference value, more preferably a tolerance of 2 minutes relative to a reference value; or to at least 99.9% of the specified value;

(b) having precisely formed (often, very smooth) surfaces with a roughness of less than 100 Angstroms rms relative to a reference surface, more preferably with a roughness configuration closely matching that of less than 50 Angstroms rms relative to a reference surface; or, if the surface requires small irregularities it may be greater than 100 Angstroms and less than 0.00004 inch (1 micron);

(c) having angular acute features with an edge radius and/or corner radius of curvature of less than 0.001 inches (25 microns) and controlled to less than 0.1% of deviation;

(d) having an embossing depth less than 0.040 inches (1000 microns), more preferably less than 0.010 inch (250 microns);

(e) precisely controlled dimensions within the plane of the sheeting, in terms of the configuration of individual elements, and/or the location of multiple elements relative to each other or a reference point; and (f) characteristic length scale (depth, width, and height) less than 0.040 inch (one millimeter with an accuracy that is better than 0.1 percent.

In certain embodiments of precision microstructured film, discrete elements and/or arrays of elements may be defined as embossed recessed regions, or embossed raised regions, or combinations of embossed recessed and raised regions, relative to the unembossed regions of the film. In other embodiments, all or portions of the precision microstructured film may be continuously embossed with patterns of varying depths comprising elements with the characteristics described above. Typically, the discrete elements or arrays of elements are arranged in a repetitive pattern; but the invention also encompasses non-repetitive arrays of precision microstructured shapes.

Exemplary types of precision microstructured sheeting, and their requirements of precision, include:

Retroreflective materials for road reflectors or signage, and Fresnel lenses; in such optical sheeting applications, precise flatness, angles and uniform detail are important. Cube-corner type reflectors, to retain their functionality of reflecting light back generally to its source, require that the three reflective faces of the cube be maintained flat and within several minutes of 90° relative to each other. Spreads beyond this, or unevenness in the faces, results in significant light spread and a drop in intensity at the location desired. Also, surface smoothness is required so light is not diffused.

Feature to feature accuracy for LCD display systems in which adjacent embossed recesses not only have to be precisely shaped, but the spatial relations of the array of recesses must be closely adhered to.

The ability to manufacture microstructures with an edge radius of less than 0.001 inches (25 microns) and with very sharp points and sharp ridges (less than 0.00028 inches (7 microns).

Volumetric accuracy for microfluidic and microwell applications with 90% or greater accuracy of the cross sectional area being conserved through the length of channel; and from channel to channel, and/or well to well, in which dimensions range from 0.00020 to 0.008 inches (5–200 microns) depth; 0.00020 inches to 10 inches (5 microns to 25.4 cm). The channels may have convoluted shapes and microtextured shapes.

Surface roughness for microfluidic applications that allow for low friction and minimal surface drag, all resulting in smooth continuous non-diffusive flow, allowing the fluid flowing laminar.

The avoidance of residual stresses by providing essentially stress free microstructures. This is critical for some optical, FSA, and for microfluidic applications were the detection mechanisms uses fluorescent polarization technology. Materials with stress generally have strand orientation, which acts like a polarizing lens. Materials that contain residual stresses may relax that stress during subsequent processing or during the life cycle of the product, resulting in dimensional instability.

The precision microstructured pattern typically is a predetermined geometric pattern that is replicated from the tooling. It is for this reason that the tooling of the preferred embodiment is produced from electroformed masters that permit the creation of precisely designed structures. In contrast, high tensile stainless steel, which has typically been used in the bands of double band presses, is not well suited to creation of tooling for embossing of such precisely controlled microstructures.

The double band embossing apparatus of the invention uses a nickel embossing belt (and possibly two such embossing belts) having an inverse topography to that of the precision microstructure to be formed in the resinous film.

A more complete understanding of the present invention and other objects, aspects, aims and advantages thereof will be gained from a consideration of the following description of the preferred embodiments read in conjunction with the accompanying drawings provided herein.

While the present invention is open to various modifications and alternative constructions, the preferred embodiments shown in the drawings will be described herein in detail. It is understood, however, that there is no intention to limit the invention to the particular form disclosed. On the contrary, the intention is to cover all modifications, equivalent structures and methods, and alternative constructions falling within the spirit and scope of the invention as expressed in the appended claims.

DETAILED DESCRIPTION OF THE INVENTION

Figure 1:
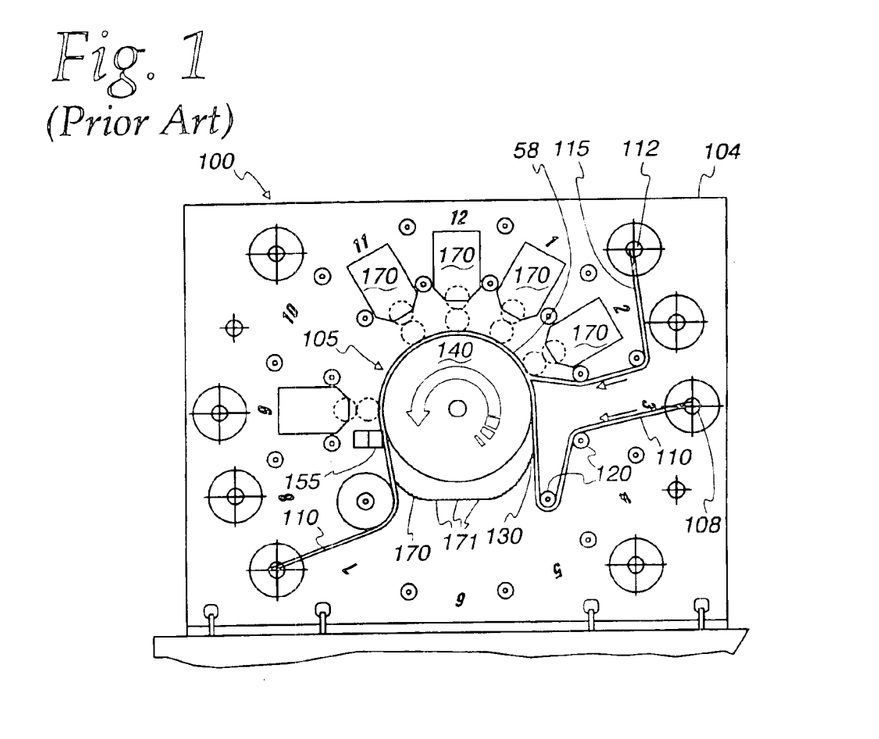
FIG. 1 is a diagrammatic view of one form of a prior art embossing machine.

Referring now to FIG. 1, a modified form of an existing embossing machine 100 for producing an embossed substrate or film 110 is shown in elevation, suitably mounted on a floor 102. This machine is similar in operation to those disclosed in aforementioned U.S. Pat. No. 4,486,363, but instead uses a single large roller and different pressure rollers. It is disclosed in greater detail in commonly assigned U.S. application Ser. No. 09/776,281, filed Feb. 2, 2001, entitled "Method of Making a Flexible Substrate Containing Self-Assembling Microstructures," incorporated herein in full by reference. The machine 100 includes a frame 104, centrally mounted on which is an embossing means 105. A supply reel 108 of unembossed thermoplastic film 110 and a supply reel 112 of flexible plastic carrier film 115 are mounted on the frame 104. The film 110 may be 0.005 inches (125 $\mu$m) thick and the carrier film 115 may be about 0.002 inches (50 $\mu$m) thick. The film 110 and the carrier film 115 are fed over guide rollers 120, in the direction of the arrows.

The embossing means 105 includes an embossing tool in the form of an endless metal belt 130 which may be about 0.020 inches (0.5 $\mu$m) in thickness and approximately 36 inches (91.44 cm) in diameter with the circumference being about 113 inches (287 cm). The dimensions depend in part upon the width of the material to be embossed, the desired embossing speed, and the thickness of the belt 130. The belt 130 is mounted on and carried by a heating roller 140 and a shoe 150 having multiple rollers 151 with parallel axes. The roller 140 is driven by a chain (not shown) to advance the belt 130 at a predetermined linear speed in the direction of the arrow.

A plurality of pressure rollers 170 of a resilient material, are spaced around the belt. The rollers 170 are shown in dashed lines in two positions, engaged or retracted. The roller position and applied pressure may depend on the material and its $T_g$ (as defined hereinafter) of the thermoplastic film 110.

The shoe 170 and rollers 171 are arranged so that the belt 130 is raised off of the heating roller 140 as it rotates, and then returns to the roller 140. Removing the belt enables it to cool quickly, and cooling is facilitated by a cooling knife or blade 155 positioned just prior to the shoe 150. The shoe also may be hollow and a chilled fluid may flow through it.

The film 110 and the carrier film 115 are superimposed to form a laminate 180 which is introduced between the belt 130 and the leading pressure roller 170. The laminate is moved with the belt 130 to pass under the remaining pressure rollers 170 and around the heating roller 140 and from there along the belt 130 around a portion of the shoe 150. Thus, one face of the web 110 directly confronts and engages the embossing pattern of the belt and one face of the carrier film 115 directly confronts and engages the pressure rollers 170.

While this form of embossing equipment produces satisfactory film, there are inherent production limits to equipment of this design, including limited area where pressure is applied; formation on a curved plane (potentially causing internal stresses and causing tooling design to become complex), and speed and volume limitations.

Figure 5:
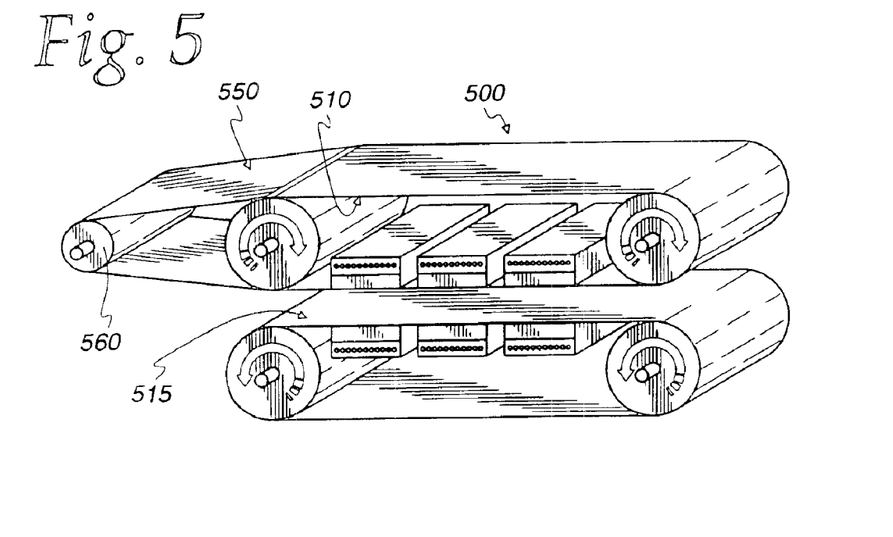
FIG. 5 is a diagrammatic isometric view of a second embodiment of a double band press for embossing precision microstructures into thermoplastic film.
Figure 6:
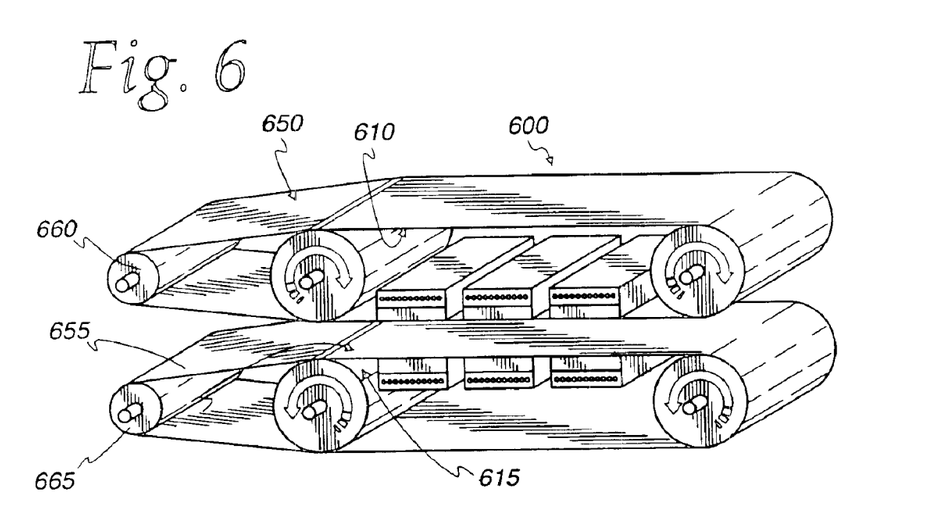
FIG. 6 is a diagrammatic isometric view of a third embodiment of a double band press for embossing precision microstructures into thermoplastic film.

The continuous press of the present invention includes several major variations in double band design. The press may include a single patterned belt to form a precision microstructure pattern on one surface of the resinous sheeting, or may include two such belts in order to emboss both sides of the sheeting. Each of the patterned belt(s) may be mounted to the continuous double band press as the only band or belt on that side of the press; or the patterned belt may be a secondary belt, which is mounted to a primary band on the press as further described below. Various embodiments are shown in FIGS. 2, 5 and 6.

Figure 2:
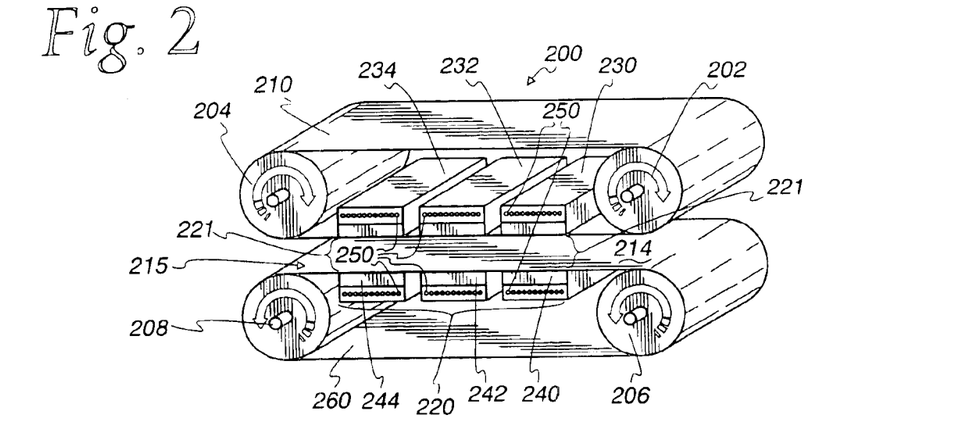
FIG. 2 is a diagrammatic isometric view of a first embodiment of a double band press modified for embossing to provide precision microstructures thermoplastic film.

In the embodiment of FIG. 2, the patterned band 210 serves both to emboss the thermoplastic sheeting, and to seal in the pressurized fluid of the isobaric press. The embodiment illustrated in FIG. 5 involves a press with a primary band 510 and secondary embossing belt 550 on the top side and with only a primary band 515 on the lower side. In the embodiment of FIG. 6, primary bands 610 and 615, which may be chrome polished stainless steel, provide the sealing function, and secondary patterned belts 660 and 665 are mounted to rotate with the primary bands. These respective embossing press configurations will now be described in greater detail.

Referring now to FIG. 2, a continuous press 200 is diagrammatically illustrated. The press 200 includes a pair of upper rollers 202, 204 and a pair of lower rollers 206, 208. The upper roller 202 and the lower roller 206 may be oil heated. Typically the rollers are about 31.5 inches (80 cm) in diameter and extend for about 51 inches (130 cm). Around each pair of rollers is a belt typically of steel, but nickel is preferred for microstructure embossing.

An improved belt and method of making same is hereinafter described. An upper patterned belt 210 is mounted around the upper rollers 202, 204 and a lower plain surfaced belt 215 is mounted around the lower rollers 206, 208. The direction of rotation of the drums, and thus bands 210 and 215, is shown by the curved arrows. Heat and pressure are applied in a portion of the press referred to as the reaction zone 220, also defined between the bands by the brackets 221. Within the reaction zone are means for applying pressure and heat, such as three upper matched pressure sections 230, 232, 234 and three lower matched pressure sections 240, 242, 244. Each section is about 39 inches (80 cm) wide and approximately 51 inches (130 cm) long. Heat and pressure may be applied by other means as is well known by those skilled in the press art. Also, it is understood that the dimensions set forth are for existing continuous presses, such as those manufactured by Hymmen; these dimensions may be changed if found desirable.

The upper surface 214 of lower belt 215 may be smooth if only one side of the film is to be embossed with features. For optical products, the belt may be embossed such that the back surface takes on the surface finish of any carrier film, and provides adequate smoothness. If both sides of the film are to be embossed, then both the upper belt 210 and the lower belt 215 will be provided with the inverse of the topography to be embossed.

It is to be understood that each of the pressure sections may be heated or cooled; i.e., the temperature of each press section can be independently controlled. Thus, for example, the first two upstream pressure sections, upper sections 230, 232 and the first two lower sections 240, 242 may be heated whereas the downstream sections 234 and 244 may be cooled or maintained as a relatively constant but lower temperature than the heated sections. It will be observed from FIG. 2 that each of the pressure sections may have provisions for circulating heating or cooling fluids therethrough, as represented by the circular openings 250.

The process for embossing the thermoplastic film to precise microstructure formation consists of feeding a thermoplastic film (or extrudate resin) into the press 200; heating the material to an embossing temperature $T_e$ above the glass transition temperature $T_g$ (e.g. about 100° F. to 150° F./38° C. to 66° C. above that glass transition temperature); applying pressure of about 150–700 psi/ 1.03–4.83 MPa (e.g. 250 psi/1.7 MPa) to the film; cooling the embossed film at the cooling station which can be maintained below ambient temperature (e.g. at about 72° F.; 22° C.) and maintaining a pressure of about 150–700 psi/ 1.03–4.83 MPa (e.g. about 250 psi/1.7 MPa) on the material during the cooling step.

With the dimensions and reaction zones stated above, the process rate may move at about 21 to 32 feet (6.40 to 9.75 meters) per minute, much greater than the rate of existing prior art machines.

For a given size embossing belt, and press machine, the embossing goal is to maximize production. Other things equal, the design that uses more of the belt's length is better. Length might be used for forming or for cooling. At the maximum running speed, these two minimum times (forming and cooling) occupy all the available length. The minimum time (length) required for forming may be less than, equal to, or greater than the minimum time (length) required for cooling. The present equipment permits some variation of these distances by virtue of the pressure plate arrangements. Additional pre-heating of the film before entry to the reaction zone, or post-reaction zone cooling also may be provided, depending on the materials used.

In the embodiment of FIG. 2, the patterned belt(s) 210 (and possibly 215) is mounted to the rollers 202, 204 as the only band or belt on that side of the press. In isobaric double band presses such as that of Hymmen GmbH, the bands serve to seal in the pressurized fluid (oil or air), which can be under an elevated pressure as great as 1000 psi (6.9 MPa).

This requires that the belt have adequate mechanical strength (tensile strength and yield strength) to withstand the high pressures.

The reaction zone 220, 221 is formed between the lower run of the upper press band 210 and the upper run of the lower press band 215 in which the material sheet or web is fed, which is of a synthetic thermoplastic resin.

Figure 4:
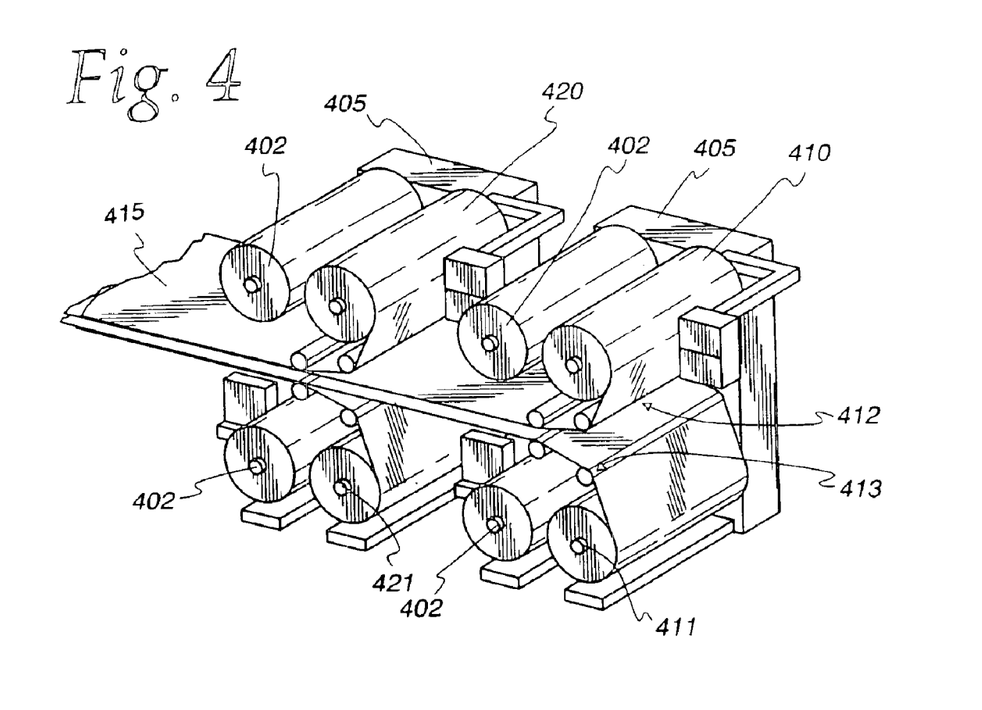
FIG. 4 is an illustrative form of prior art feed mechanism which may be used in conjunction with the double band press of the present invention for feeding one or more layers of film into the press.

The reaction zone pressure can be applied hydraulically to the inner surfaces of the endless press belts 210 and 215 by the opposing pressure plates 230, 232, 234, and 240, 242, 244 and is transferred from the belts to the film material fed therebetween (see FIG. 4). Reversing drums 202 and 206 arranged at the input side of the press are heated and, in turn, heat press belts 210 and 215. The heat is transmitted through the belts into the reaction zone where it is supplied to the film material. Similarly, the opposite reversing drums 204 and 208 may be arranged for additional cooling of the belts.

The pressing force is provided on the film material sheet in the reaction zone 220, 221 by a fluid pressure medium introduced into the space between the upper and lower pressure plates and the adjacent inside surfaces of the press belts located between the drums, which portions of the belts form the reaction zone. The space forming the so-called pressure chamber (exemplified for the lower belt as 260) is defined laterally by sliding seals. In order to avoid contamination of the film, desirably compressed air or other gases (as opposed to liquids) are used as the pressure medium in the pressure chamber of the reaction zone.

In the isobaric double band presses of Hymmen GmbH, in order to seal the highly pressurized air, the press includes cushion seals formed with highly smooth surfaces on the double bands. These provide a sliding seal to contain pressures of hundreds of pounds per square inch. In the case of a patterned belt 210, the sealing surface is the opposite face of the belt from that containing the precision microstructure pattern. If the continuous press includes an unpatterned band, likewise a very smooth surface finish is required that may be provided for example using a polished chrome surface of a stainless steel band. In the case of the Hymmen isobaric press, a surface finish of 0.00008–0.00016 inches (2–4 micron) $R_z$ is required, which is equivalent to 80–160 microinch rms in English units. Cf. American National Standards Institute, "Surface Finish", ANSI B46.1. Surface treatment techniques such as polishing, electropolishing, superfinishing and liquid honing, can be used to provide the highly smooth surface finishes of belts 210, 215.

Figure 3:
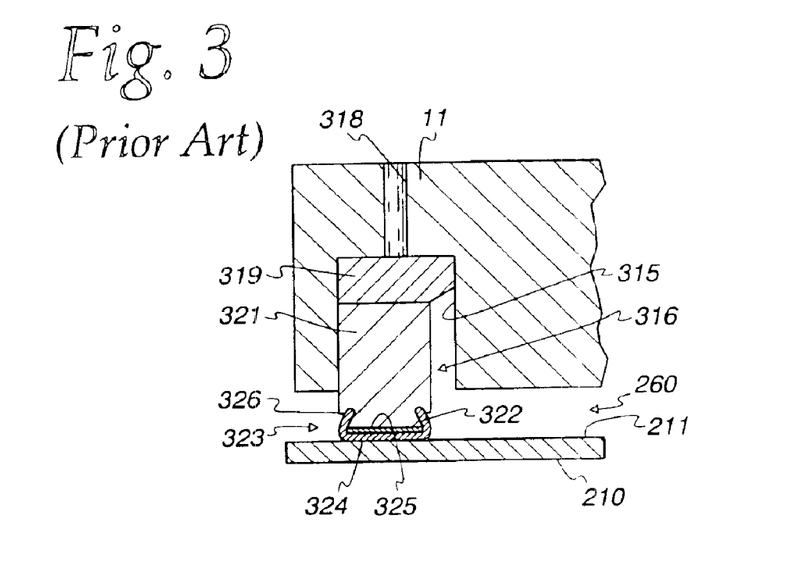
FIG. 3 is a partial sectional view illustrating a pressure plate and a sliding seal contacting a press belt of a type contemplated for use with the present invention.

FIG. 3 illustrates one form of prior art sliding seal 300 that can be used in the continuous presses of FIGS. 2, 5 and 6. It is more completely described in U.S. Pat. No. 4,711,168. The edge or border of the press band 210 which is parallel with the forward running direction of the film, has a groove 315 running parallel to the border and containing a sliding seal 316. The sliding seal is arranged to be displaceable vertically relative to the inside surface 211 of the press belt 210 facing toward the upper pressure plates. The pressure within the pressure chamber 260 between the pressure plate 230, the inside surface 211 of the press belt 210 and the sliding seal 316 holds the sliding seal in contact with one of the inner walls of groove 315 (the left hand wall as viewed in FIG. 3), so that the seal is slidingly displaceable.

A borehole 318 opens into the base of the groove 315 so that the pressure source can act through the borehole 318 on an elastic O-ring 319 against the seal 316. In turn this presses against the inner surface 211 of the press belt 210 so that the pressure chamber is sealed against the ambient atmospheric side of the structure. The contact pressure of the seal against the press belt can be effected in other ways, for example by means of a spring.

The seal 316 further includes a body 321 formed of a metallic material preferably high tensile steel. The body is substantially rectangular with the addition of a profiled base 322. A sliding surface formed as a sliding cap 323 is fitted on and securely connected to the base 322. The sliding cap is formed of a composite material and includes a dry sliding layer 324 and a carrier layer 325. The carrier layer of the composite material may be a copper plated steel band which is particularly advantageous for the production of the sliding cap. Further details of this form of seal and its construction can be found with reference to U.S. Pat. No. 4,711,168, incorporated in full by reference.

Recesses 326 are formed in both sides of the body 321 at the transition with the base 322. The sliding cap 323 is secured to the base 322 with the carrier layer 325. The carrier layer 325 bearing against the base 322 with the dry sliding layer facing toward the inner surface 211 of the press belt 210 and with the opposite edges of the cap being fitted in to the recesses 326. Accordingly, the sliding cap 323 is firmly anchored to the base 322 by plastic deformation.

In the FIG. 2 embodiment, the patterned band 210 serves both to emboss the thermoplastic sheeting and to seal in the pressurized fluid of the isobaric press. The material fed into the press may include a PMMA thermoplastic sheet to be embossed along with a PET smoothing or carrier film, and this carrier film is later stripped off. In an alternative embodiment of FIG. 5, primary bands 510 and 515, which may be chrome polished stainless steel, provide the sealing function, and a secondary overlay patterned belt 550 is mounted to rotate with the primary bands. The end of the secondary belt pass around rollers 560. The patterned secondary belt acts to emboss the precision microstructures on one or both surfaces of the thermoplastic material. The secondary belt 550 should have a very smooth surface and highly uniform thickness for compatibility with the primary bands of the double band press 200.

FIG. 4 is diagramatically illustrative of a device for concurrently feeding several layers of thermoplastic material together, which may be either combined to form an embossed laminate film and/or may include a carrier film for providing a smooth optical surface on one layer of the laminate. In this case, the individual film can consist of conventionally extruded and calendered thermoplastic rolls which are stored upon rollers such as 410, 411 until they can be further processed.

The rolls 410 and 411 with film are installed on a frame to feed the double band press 200. These rolls provide individual films 412 and 413 which are fed together to the entrance of the double band press 200 to form a layered web 415 and then are introduced into the double band press 200. Alternately, substitute rollers 420, 421 can be provided for each roller so that when one roller is empty production can be maintained without interruption. Further, multiple layers of film may be added to provide a laminate and/or to provide a carrier film such as Mylar (as used in the prior art devices); these alternate materials may be fed from one of the other rollers 420, 421.

In the embodiment of FIG. 5, the press 500 is provided with upper and lower bands 510 and 515. Those may be the conventional stainless steel bands which typically are provided for this equipment, together with appropriate seals. Added to the upper band is an overlay or secondary embossing belt 550. Providing the embossing tool as a secondary belt 550 has several primary advantages and some disadvantages. Because nickel has a lower tensile strength than the traditional steel belts, it is more likely that the nickel embossing belt will wear out more frequently. Alternatively, because it is made of nickel and can be easily electroformed, it is easier to accurately replicate a precisely formed microstructure. As noted, a separate seal from the pressure chamber is not required for the overlay. One disadvantage of the overlay band is that necessary tracking rollers, such as 560 need be provided to facilitate proper alignment of the secondary belt 550 as it moves through the press. Computer-aided controls (not shown), through the use of lasers or other detection devices, can determine if the belt 550 becomes slightly misaligned, and through appropriate controls of the steering/tracking wheel 560, proper alignment of the secondary band 550 on the primary band 510 can be achieved.

FIG. 6 is similar to the embodiment of FIG. 5, but in this instance double overlay embossing bands 650, 655 are provided on both the upper and lower bands 610, 615 of the press 600. In this case, the secondary embossing bands 650 and 655 may be used for double-sided embossing of the particular film. A pair of steering/tracking wheels 660 and 665 are provided for alignment purposes for each overlay band.

In some instances the opposite face of the film may need a highly smooth surface, e.g. for optical applications. This may be done by replicating a highly polished surface on the main press band for use on the proper side of the continuous press, or, alternatively, by using a highly smooth, high glass transition temperature polymer or foil which may be fed as a carrier film through the press along with the film to be embossed, and stripped from the embossed film after removal from the press. In this instance care must be taken to avoid both air entrapment and potential fusing of the carrier film to the embossed film, resulting in a distorted or inadequate optical surface. This was observed in experimental runs of such film with high degrees of magnification. While the cube corners were accurately embossed, post-embossing cleaning of the front "smooth" surface would appear to modulate such deleterious affects and permit adequate results.

Considering now the resinous film material in greater detail; for purposes of the present invention, two temperature reference points are used: $T_g$ and $T_e$.

$T_g$ is defined as the glass transition temperature, at which plastic material will change from the glassy state to the rubbery state. It may comprise a range before the material may actually flow.

$T_e$ is defined as the embossing or flow temperature where the material flows enough to be permanently deformed by the continuous press of the present invention, and will, upon cooling, retain form and shape that matches or has a controlled variation (e.g. with shrinkage) of the embossed shape. Because $T_e$ will vary from material to material and also will depend on the thickness of the film material and the nature of the dynamics of the continuous press, the exact $T_e$ temperature is related to conditions including the embossing pressure(s); the temperature input of the continuous press and the press speed, as well as the extent of both the heating and cooling sections in the reaction zone.

The embossing temperature must be high enough to exceed the glass transition temperature $T_g$, so that adequate flow of the material can be achieved to provide highly accurate embossing of the film by the continuous press.

Numerous thermoplastic materials may be considered as polymeric materials to provide precision microstructure film. However, not all can be embossed on a continuous basis. Applicants have experience with a variety of thermoplastic materials to be used in continuous embossing under pressure at elevated temperatures. These materials include thermoplastics of a relatively low glass transition temperature (up to 302° F./150° C.), as well as materials of a higher glass transition temperature (above 302° F./150° C.).

Typical lower glass transition temperature (i.e. with glass transition temperatures up to 302° F./150° C.) include materials used for example to emboss cube corner sheeting, such as vinyl, polymethyl methyacrylate, low $T_g$ polycarbonate, polyurethane, and acrylonitrile butadiene styrene (ABS). The glass transition $T_g$ temperatures for such materials are 158° F., 212° F., 302° F., and 140° to 212° F. (272° C., 100° C., 150° C., and 60° to 100° C.).

Higher glass transition temperature thermoplastic materials (i.e. with glass transition temperatures above 302° F./150° C.) which applicants assignee have found suitable for embossing precision microstructures, are disclosed in previously identified co-pending patent application U.S. Ser. No. 09/776,281, filed Feb. 2, 2001. These polymers include polysulfone, polyarylate, cyclo-olefinic copolymer, high $T_g$ polycarbonate, and polyether imide.

A table of exemplary thermoplastic materials, and their glass transition temperatures, appears below as Table I:

TABLE I

| Symbol | Polymer Chemical Name | $T_g$ ° C. | $T_g$ ° F. |
|---|---|---|---|
| PVC | Polyvinyl Chloride | 70 | 158 |
| Phenoxy | Phenoxy PKHH | 95 | 203 |
| PMMA | Polymethyl methacrylate | 100 | 212 |
| BPA-PC | Bisphenol-A Polycarbonate | 150 | 302 |
| COC | Cyclo-olefinic copolymer | 163 | 325 |
| Polysolfone | Polysulfone | 190 | 374 |
| Polyarylate | Polyarylate | 210 | 410 |
|  | High $T_g$ polycarbonate | 260 | 500 |
| PEIPI | Polyether imide | 260 | 500 |
| Polyurethane | Polyurethane | varies | varies |
| ABS | Acrylonitrile Butadiene Styrene | 60–100 | 140–212 |

The thermoplastic sheeting also may comprise a filled polymeric material, or composite, such as a microfiber filled polymer, and may comprise a multilayer material, such as a coextrudate of PMMA and BPA-PC.

A variety of thermoplastic materials such as those listed above in Table I may be used in the press 200 (or the other embodiments described). Relatively low $T_g$ thermoplastic materials such as polymethyl methyacrylate, ABS, polyurethane and low $T_g$ polycarbonate may be used in the press 200. Additionally, relatively high $T_g$ thermoplastic materials such as polysulfone, polyarylate, high $T_g$ polycarbonate, polyetherimide, and copolymers also may be used in the press 200. Applicants have observed as a rule of thumb that for good fluidity of the molten thermoplastic material in the reaction (embossing) zone, the embossing temperature $T_e$ should be at least 50° F. (10° C.), and advantageously between 100° F. to 150° F. (38° C. to 66° C.), above the glass transition temperature of the thermoplastic sheeting.

With such thermoplastic material the pressure range is approximately 150 to 700 psi (1.03 to 4.82 MPa), and potentially higher, depending on factors such as the operational range of the continuous press; the mechanical strength of the embossing belt (high pressure capacity); and the thermoplastic material and thickness of the thermoplastic film.

It is desirable that the material, after being exposed to heat and pressure, be cooled under pressure. Thus, it is contemplated that the cooling station will be maintained in the range of 35° F. to 41° F. (2° C. to 5° C.) and the pressure range approximately 150 to 400 psi (1.03 to 2.76 MPa). The pressure in the reaction zone will be similar for heating and cooling.

Thermoplastic materials of thicknesses of up to 0.250 inches (6.35 microns) may be embossed with precise formations in the range of 0.0004 to 0.040 inches (0.1 to 1000 microns) deep.

The apparatus of the present invention allows for the thermoplastic film material to be relatively thick and yet still have precision microstructures in one or both major surfaces. This allows products as diverse as office light diffusers, reflective signage, compact disks, flat panel displays, high-efficiency lighting systems for internally illuminated signs and medical diagnostic products to be efficiently, effectively and inexpensively manufactured. Another exemplary application is retroreflective lenses for road markers, which are more than 0.04 inches (1 mm) thick. The embossing is on the order of 0.008 inches (0.2 mm) deep.

In embossing relatively thick thermoplastic sheeting, the apparatus of the invention can emboss both sides of the sheeting without heating the center. Besides double sided embossing of a monolayer sheet, the embossing process of the invention permits the embossing of two sheets separated by a separator sheet, which are later stripped apart; an example is a sandwich of PMMA, PET, and PMMA films.

As a further variation, the thermoplastic film may be a coextruded, peelable construction such as disclosed in U.S. Pat. No. 4,925,714, wherein after embossing of the faces of the sheeting, and cooling and removal of the sheeting from the continuous press, two embossed films may be separated from each other at a peelable interface. Care must be taken to avoid air entrapment between the layers resulting in a less than perfect optical surface under certain conditions.

Where it is required to register the images embossed on both sides of the thermoplastic sheeting, a suitable mechanical and/or electro-optical subsystem may be provided to ensure the registration of the embossed images, as known in the art of registration printing. In some applications, however, registration of the embossed images would not be required.

The use of the phrase "thermoplastic material" in the appended claims is intended to cover all of the foregoing possibilities—single layer film; laminates; use of a strippable carrier and registered and unregistered embossing.

Thus the use of the present apparatus also permits the embossing of relatively stiff sheeting, wherein the stiffness may depend both on the thickness and elasticity modulus of the material to be embossed. Films of polycarbonate less than about 15 mils (375 microns) thick can be run through a prior art belt embosser, while films of polycarbonate greater than about 30 mils (750 microns) thick may require use of the flat bed embossing apparatus of the present invention.

In the preferred embodiments of the invention as described herein, the patterned belt 550 (or 650 and 655) is created using an electroformed master, and then assembling a tool by laser welding multiple electroformed segments into a long belt. One reason for this assembly is the significantly larger size of the belts used in the double band press. Previously one piece flexible belts, on the order of 36 inches (91 cm) in diameter and 52 inches (132 cm) wide, had been produced using the technologies disclosed in U.S. Pat. Nos. 4,478,769 and 5,156,863, incorporated herein in full by reference. The perimeter of such belts is about 113 inches (287 cm). Bands used on the Hymmen style press, however, have a perimeter of about 368 to 371 inches (934 to 942 cm), almost four times larger. It would be very complex and costly to electroform a belt of such size. The belt can be created using alloys of metals, such as nickel, cobalt and manganese, used in high strength electroforming applications. The belt can be subjected to heat treatment techniques, in order to provide adequate strength.

In welded belts, weld lines may represent areas of weakness; this problem can be addressed by improving the strength of the weld joints, and by reducing the number of weld joints. For example in the case of electroformed nickel belts formed by welding multiple segments, the strength of the belt at nickel to nickel weld joints is poor and is considerably less than that of the nickel itself. In comparison, it has been found that nickel to stainless steel laser welds are very strong. Such weld joints for example may use stainless steel wire, or strips of stainless steel. Exemplary materials are various types of stainless steel, e.g. SS #301, SS # 302, SS # 304 and SS # 316. Steels with too much carbon, such as SS#303, may not perform as well.

Laser welding of pure nickel produces a structurally weak weld joint due to the material properties of the nickel. According to tensile strength testing, solid nickel as used by applicants has a tensile strength (UTS value) of about 89,000 psi (613 MPa). Welding of this pure nickel to nickel resulted in a UTS value of only 53,000 psi (365 MPa). With the introduction of Stainless Steel (#301) ions in the laser welding process, the UTS value was increased to about 71,800 psi (495 MPa).

An embossing belt 550 for exemplary use in the continuous press of FIG. 5 had a 419+ inch (1247 cm) perimeter and was 29.53 inches (75 cm) wide; this belt was fabricated as follows. The method of commonly assigned U.S. Pat. No. 4,478,769 was used to create a "mother" mold with a retroreflective optics pattern. A series of four such Nickel belts were electroformed from the mother cylinder, as disclosed in the '769 patent. Individual segments about 52.411 inches (133 cm) by 29.53 inches (75 cm) were laser cut from each belt, and re-assembled via laser welding, to form the embossing belt 550.

Figure 7A:
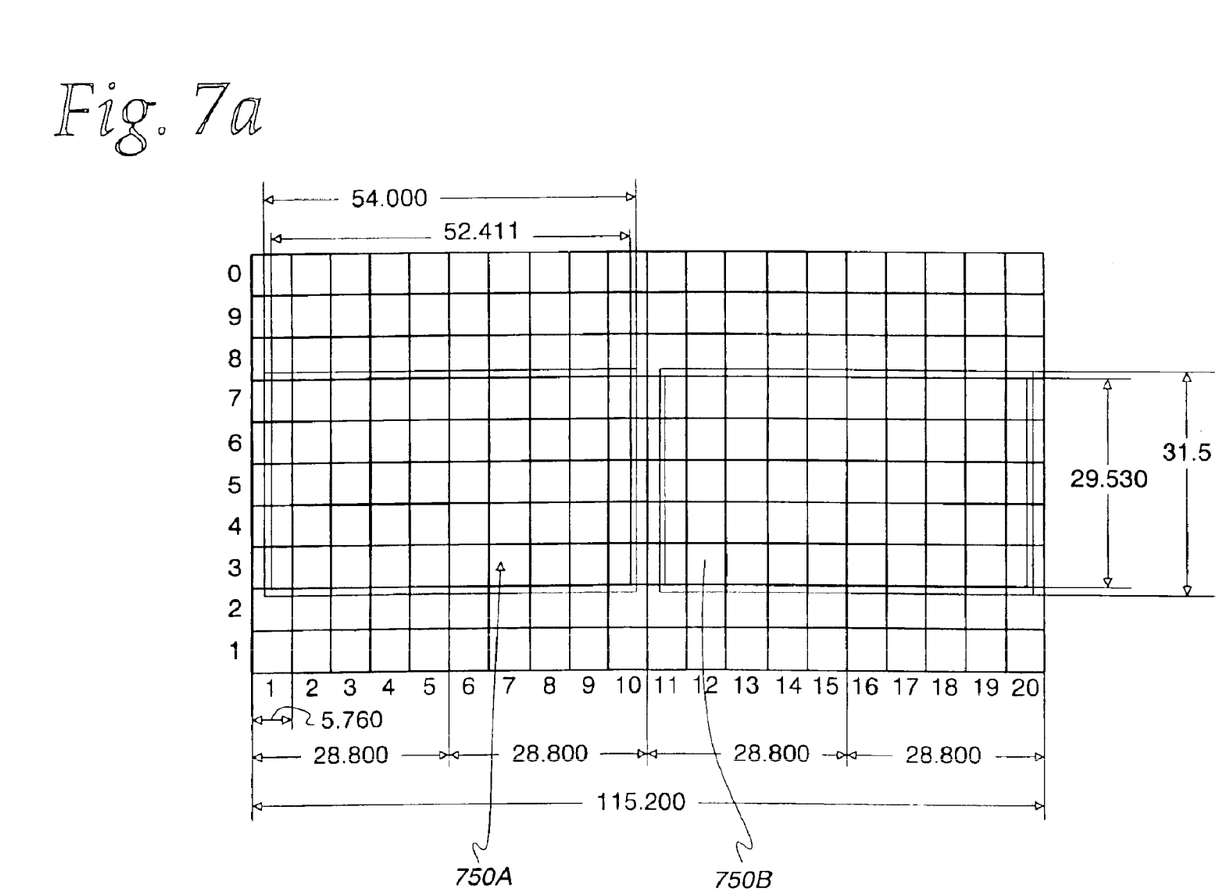
FIG. 7A is a plan view of the layout of an electroformed belt and of belt segments which may be cut from the electroformed belt.

With reference to the diagram of FIG. 7A, eight individual belt sections, such as 750A, 750B were laser cut from a series of four belts. Rough-cut segments of 54 inches by 31.5 inches (137 cm by 80 cm) were laser cut from each of the four belts as indicated in FIG. 7A. The rough-cut segments were then trimmed by laser to the desired size. These segments were 52.411 inches (133 cm) long and 29.53 inches (75 cm) wide, with a salvage of approximately 0.5 inch (1.27 cm) on all edges and the edges and the edges were parallel and the cut lines were square within a tolerance of 0.005 inches (1.27 cm). Curved belt segments were coated at their optics face with a protective coating, and run through a three-roll straightener until they were flat. The segments were then repeatedly run through a sander on the free electroform side until they were flat and uniform, then these segments were cleaned in anticipation of the welding operation.

Figure 7B:
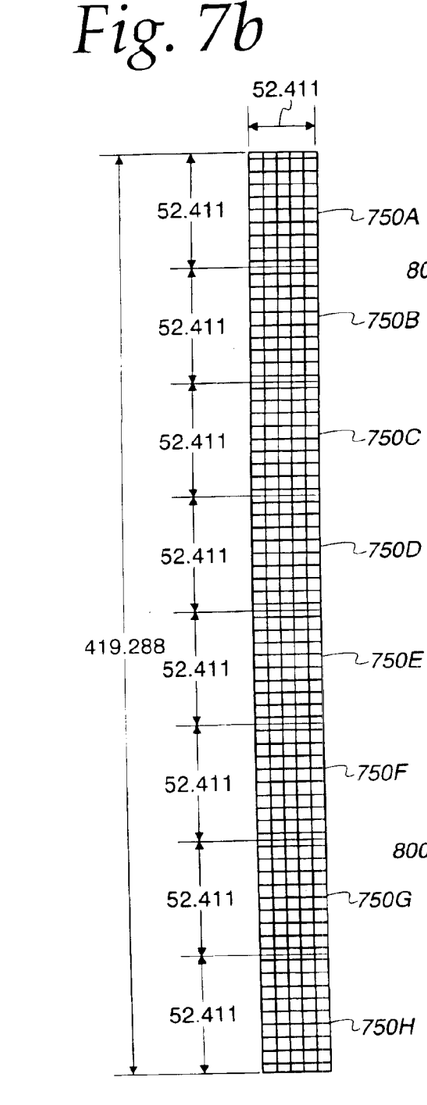
FIG. 7B is a plan view of a series of belt segments laser welded together in a manner consistent with one aspect of the invention, to form a continuous flexible embossing tool for use in the double band press of any one of the embodiments illustrated herein.

As shown in FIG. 7B, the eight belt segments 740A through 750H were then laser welded at butt joints along the segments' 29.53 inches (75 cm) side to form the embossing belt 750. The welding was done within a tolerance of 0.079 inches (200 microns) overall length variation, measured from side to side of the belt. This length belt (412+ inches/ 1.05+ meters) was produced so it could be run as an overlay belt such as 550 with a tracking wheel, as shown in FIG. 5.

The exact belt length will be determined by the press set up to be employed. The welds were done by laser weld using stainless steel interface inserts at each weld. A range of thickness can be welded in this manner. Interface inserts and from 0.001 inches to 0.010 inches (25 microns to 254 microns) were successfully used.

In this instance, the belt was 0.030 inches (762 microns) thick, and the depth of penetration of the welds was ~0.025 inches (635 microns) from the back side and about ~0.005 inches (127 microns) from the front patterned side—to minimize distortion of the adjacent pattern.

The typical stainless steel bands used on the Hymmen equipment have a tensile strength of 167 k psi (1.15 GPa) and fatigue strength on reverse bending of 72.5 k psi (0.5 GPa). The strength of ordinary welded nickel belts is considerably below this, but the use of the stainless steel interface inserts during the welding process produced tensile strength of 72.5 k psi (0.5 GPa), compared to nickel to nickel welds which produced tensile strength of 53 k psi (0.37 GPa).

An alternative way of making belts to perform a precision microstructure may include, for example, laser formation of flat to cylindrical tooling techniques. For example, one form of laser machined replication tooling is disclosed in U.S. Pat. No. 5,792,411. In U.S. Publication 2001/0032703, there is also disclosed a method of making a mold of patterned surface articles which consists of forming a planar tool having one pattern on one side, of using the opposing ends of the flat tool to form a substantially cylindrical shape, and then of welding the ends together in one of various ways, but without any interface material in the welds, where the interface material is a different material than the tool material. However such simple welding, for example, of nickel to nickel, does not have adequate tensile strength at the weld line to provide the much higher tensile strength required in continuous band presses. The technique developed pursuant to the invention disclosed herein provides a significant improvement over the prior art.

Figure 8A:
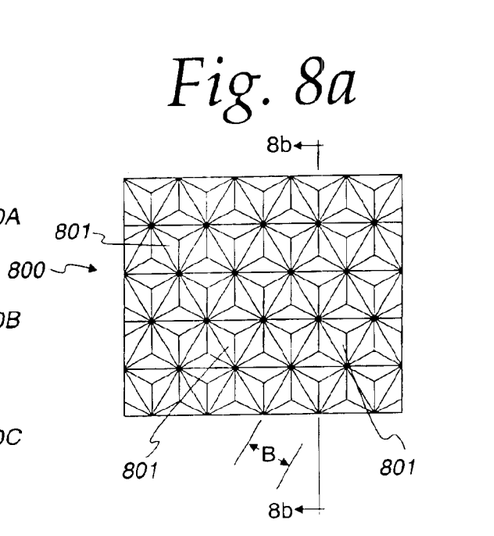
FIG. 8A is a greatly enlarged plan view of one form of a precision microcube corner array which may be formed using the method and apparatus of the present invention.
Figure 8B:
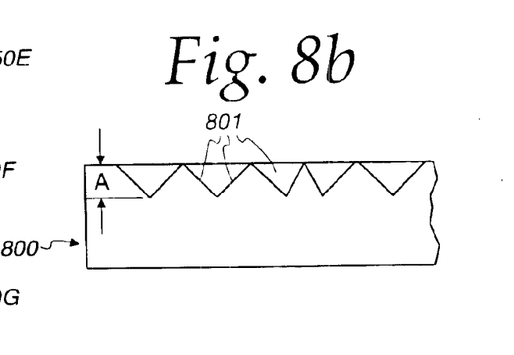
FIG. 8B is a sectional view of the cube corner array of FIG. 8A, taken in the direction of the arrows 8A—8A.
Figures 9, 10A:
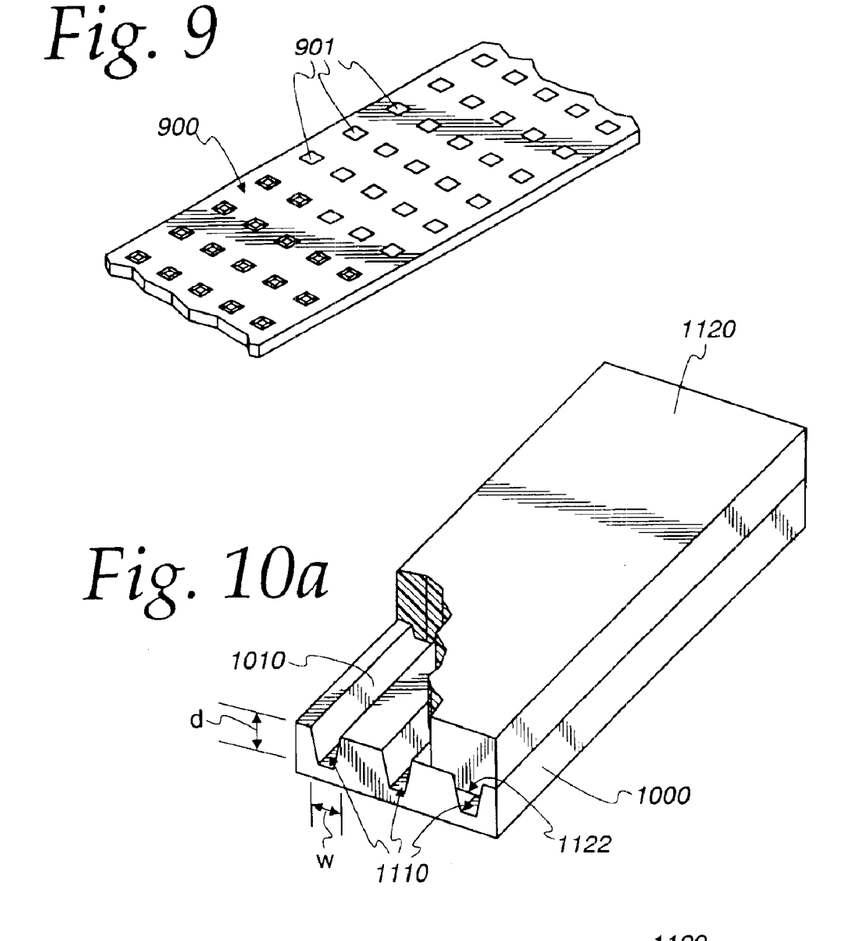
FIG. 9 is an illustrative view of a thermoplastic web which may be made pursuant to the present invention and in which a pattern of precise geometric microstructures are formed for the purpose of fluidic self-assembly of nanoblocks.
FIGS. 10A and 10B are illustrative isometric and section views of one type of a microfluidic channel which could be made in accordance with the present invention.
Figure 10B:
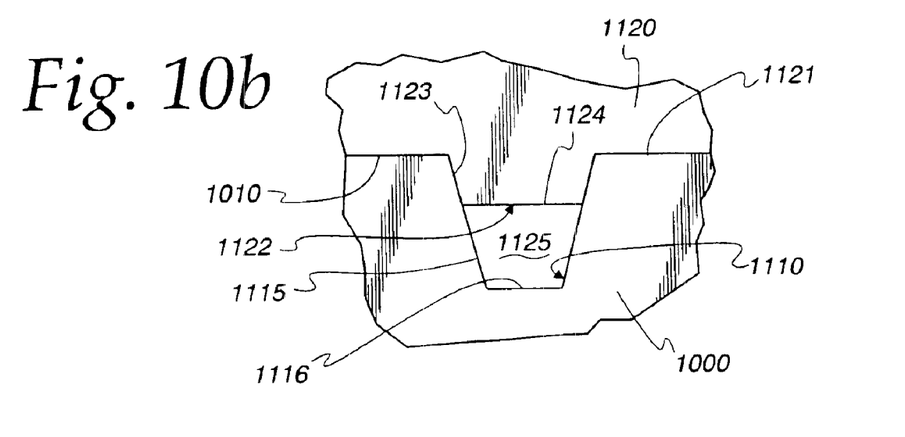

Several examples of precision embossed microstructures are illustrated in FIGS. 8 through 10.

A typical retroreflective pattern of film 800 with microcube elements 801 formed with the aid of the embossing tool 750 such as that depicted in FIG. 7B is illustrated. Shown in FIG. 8B, the microcube pattern so formed on film 800 would have on one surface male cube corner elements 801 having a depth illustrated, for example, by dimension A which may be 0.00338 inch (85.85 microns). Dimension B on FIG. 8A represents the distance between parallel grooves, which for the "A" dimension provided, would be about 0.0072 inch (189 microns). It will be understood, of course, that these dimensions may vary but they tend to be generally within a fairly narrow but precise range. Similarly, the dihedral angles forming the cube faces are accurate within two minutes of the desired dihedral angle (usually 90°).

The continuous press 200 also may be used to form a substrate for fluidic self-assembly of nanoblocks elements. (See, co-pending application Ser. No. 09/776,281). For instance, FIG. 9 illustrates a typical substrate or film 900 in which an array of pyramidal recesses 901 has been embossed into the film. (Only some of the full pyramidal structures are illustrated). Typically the recesses would be somewhere in the range of 0.00002–0.004 inches (5–100 microns) deep, each of the recesses being critically spaced from a reference point within microns of tolerance. Each recess may have an upwardly tapered wall angle, and for one typical example, the wall may be 57 degrees although angles between 20 degrees through 70 degrees are useful. In one embodiment, the recess may be 0.0027 inches (69 microns) deep, the base of the recess may be about 0.011 inches× 0.011 inches (280 microns×280 microns); the top rectangle may be about 0.012 inches×0.012 inches (300 microns×300 microns), with the film being about 0.007 inches (180 microns) thick.

The continuous double band press also may be useful in providing precise microstructure for microfluidic devices. Microfluidic devices with polymeric substrates are disclosed, for example, in U.S. Pat. Nos. 5,885,470 and 6,238,538 of Caliper Technologies Corp. PCT Publication No. WO99/65664 of 3M Innovative Properties Company, purports to disclose microfluidic articles formed in part by a so-called "continuous extrusion embossing process" in which polymer pellets are cast onto a heated microstructured nickel tooling.

A typical microfluidic microstructure which may be manufactured pursuant to the inventions disclosed herein would include something such as illustrated in cross-section in FIG. 10B, which includes a resinous sheeting material 1000 having embossed in one surface 1010 a microfluidic channel 1110 with sidewalls 1115 and a bottom wall 1116. A cover layer 1120 may have embossed on surface 1121 a microsized ridge 1122 having sidewalls 1123 and bottom surface 1124. When the enclosed thermoplastic sheeting material 1000 and cover layer 1120 are bonded together (FIG. 10A), they form an enclosed microfluidic channel 1125 through which fluids can be moved or stored in a chemical, biochemical or pharmaceutical assay. Other structures could include the formation of z-vias and other forms which could also be embossed into the microfluidic device. Typical dimensions of a channel may include bottom walls between 5 to 1000 microns (0.0002 to 0.04 inches); side walls tapered at angles between 10–90 degrees and the upper section of the channel being up to 0.04 inches (1000 microns) across the top; curved channel walls and curved channels also may be formed.

The specification describes in detail several embodiments of the present invention. Other modifications and variations will, under the doctrine of equivalents, come within the scope of the appended claims. For example, presses having somewhat different geometries and/or different dimensions are considered equivalent structures. Different thermoplastic material may affect pressure and temperature as well as process speed. Further, different material densities and thicknesses may also affect the apparatus and process. There is no desire or intention here to limit in any way the application of the doctrine of equivalents.

What is claimed is:

1. An apparatus for continuously forming thermoplastic products having precision microstructured surfaces thereon, comprising:

a continuous double band press having upper and lower primary bands providing a substantially planar region therebetween, at least one of said bands being provided with a tool surface having the inverse topography of the precision microstructured surface to be formed, the inverse topography being sized to provide embossing depth of less than 1000 microns;

means for continuously feeding a thermoplastic material through said press and between said bands;

means for heating said material to its embossing temperature $T_e$;

means for applying sufficient pressure to said bands to cause the precise engagement of said heated thermoplastic material with said bands and said tool surface to emboss said material with said precise microstructured pattern; and means for cooling said material while maintaining pressure on said material, and while said material is moving through said press.

2. The apparatus according to claim 1, in which the upper primary band is provided with said tool surface having the inverse topography of the structure to be formed.

3. The apparatus according to claim 1, wherein said lower primary band is provided with said tool surface having the inverse topography of the precision microstructure to be formed.

4. The apparatus of claim 1, wherein each of said upper and lower bands is provided with a tool surface having the inverse topography of the precision microstructure surface to be formed.

5. The apparatus of claim 1, and wherein said tool surface is provided on an overlay band and said overlay band is positioned on one of said upper or lower primary bands.

6. The apparatus of claim 5, wherein said overlay band is positioned on said upper primary band.

7. The apparatus of claim 6, wherein said overlay band is attached to and travels with said upper primary band.

8. The apparatus of claim 5, wherein said overlay band is positioned on said lower primary band.

9. The apparatus of claim 8, wherein said overlay band is attached to and travels with said tower primary band.

10. The apparatus of claim 5, wherein an overlay band is positioned on each of said upper and lower primary bands.

11. The apparatus of claim 10, wherein said overlay bands are attached to and travel with said upper and lower primary bands, respectively.

12. The apparatus of claim 1, wherein said pressure applying means is capable of applying pressure to said material in a range of 250 to 1000 psi (1.72 MPa to 6.89 MPa).

13. The apparatus of claim 1, wherein said heating means is capable of heating said material within a range of 250° to 750° F. (121° C. to 399° C.).

14. The apparatus of claim 1, wherein said bands are operated such that said material is fed through said press at a rate of between about 21 (6.40) and about 32 (9.75) feet (meters) per minute.

15. The apparatus of claim 1, wherein said heating means and said pressure applying means are operated so that the temperature of said material is within the range of 250° to 580° F. (121° C. to 304° C.) and said pressure is about 150–1000 psi (1.03 0 6.89 MPa).

16. The apparatus according to claim 1, wherein said cooling means cools the material to within a range of about 35° to 75° F.

17. The apparatus of claim 1, and wherein said tool surface is provided on an overlay which is attached to, and rotates with at least one of the upper and lower primary bands.

18. An apparatus for continuously forming thermoplastic products having precision microstructured surfaces thereon, comprising:

a continuous double band press having upper and lower primary bands providing a substantially planar region therebetween, at least one of said bands being provided with a tool surface having the inverse topography of the precision microstructured surface to be formed;

means for continuously feeding a thermoplastic material through said press and between said bands;

means for heating said material to its embossing temperature $T_e$;

means for applying sufficient pressure to said bands to cause the precise engagement of said heated thermoplastic material with said bands and said tool surface to emboss said material with said precise microstructured pattern; and means for cooling said material while maintaining pressure on said material, and while said material is moving through said press;

wherein said tool surface is provided on an overlay band and said overlay band is positioned on one of said upper or lower primary bands; and further including tracking/steering means for said overlay band to keep said, overlay band in alignment with said primary band.

19. An apparatus for continuously forming thermoplastic products having precision microstructured surfaces thereon, comprising a continuous double band press having upper and lower bands providing a substantially planar region therebetween, at least one of said bands being provided with a tool surface having the inverse topography of the precision microstructured surface to be formed, the inverse topography being sized to provide embossing depths of less than 1000 micron.

20. The apparatus according to claim 19, wherein the inverse topography includes at least a portion for forming an array of microcube elements.

21. The apparatus according to claim 19, wherein the inverse topography includes at least a portion for forming a pattern of microfluidic channels.

22. The apparatus according to claim 19, wherein the inverse topography includes at least a portion for forming an array of precise geometric recessed profiles.

23. The apparatus according to claim 22, wherein each recess comprises:

a flat bottom surface with a major dimension of about 1000 microns or less, an upwardly tapered wall at an angle of between 10°–90° normal to the bottom surface;

a depth of between 0.10 microns to 1000 microns; and an upper opening with a major dimension between about 0.10 microns to 1000 microns.

24. The apparatus according to claim 19, wherein the upper band is provided with the tool surface having the inverse topography.

25. The apparatus according to claim 24, wherein the tool surface is on an overlay band that is positioned on the upper band.

26. The apparatus according to claim 25, wherein the overlay band is attached to, and travels with, the upper band.

27. The apparatus according to claim 19, wherein the lower band is provided with the tool surface having the inverse topography.

28. The apparatus according to claim 27, wherein the tool surface is on an overlay band that is positioned on the lower band.

29. The apparatus according to claim 28, wherein the overlay band is attached to, and travels with, the lower band.

30. The apparatus according to claim 29, each the upper band and the lower band is provided with the tool surface having the inverse topography.

31. The apparatus according to claim 30, wherein the tool surface is on an overlay band that is positioned on the upper band and on an overland band that is positioned on the lower band.

32. The apparatus according to claim 31, wherein the overlay bands are respectively attached to, and travel with, the upper band and the lower band.

33. An apparatus for continuously forming thermoplastic products having precision microstructured surfaces, said apparatus comprising:
- a continuous double band press having an upper belt and a lower belt defining a substantially planar region therebetween through which the thermoplastic material travels;
- a reaction zone within the substantially planar region including an upstream heated section whereat the thermoplastic material is heated to its embossing temperature $T_e$ as pressure is applied and a downstream heated section whereat the thermoplastic material is cooled as pressure is applied; and
- an overlay with a tool surface having inverse topography of the precision microstructured surface to be formed, the inverse topography being sized to provide embossing depths of less than 1000 microns;
- wherein the overlay travels through the reaction zone with the thermoplastic material so that, in the upstream heated section, the tool surface precisely engages the thermoplastic material to emboss it with the precision microstructured surface.

34. An apparatus as set forth in claim 33, wherein the overlay is attached to the upper belt.

35. An apparatus as set forth in claim 34, wherein the overlay is an overlay band which travels with the upper belt.

36. An apparatus as set forth in claim 33, wherein the overlay is attached to the lower belt.

37. An apparatus as set forth in claim 36, wherein the overlay is an overlay band which travels with the lower belt.

38. An apparatus as set forth in claim 33, further comprising a second overlay also having a tool surface with inverse topography of the precision microstructured pattern to be continuously formed, the inverse topography being sized to provide embossing depths of less than 1000 microns; and
- wherein the second overlay also travels through the reaction zone with the thermoplastic material so that, in the upstream heated section, the tool surface of the second overlay precisely engages the thermoplastic material to emboss it with the precision microstructured pattern.

39. An apparatus as set forth in claim 38, wherein the first overlay is attached to the upper belt and the second overlay is attached to the lower belt.

40. An apparatus as set forth in claim 39, wherein the first overlay is an overlay band which travels with the upper belt and the second overlay is an overlay band which travels with the lower belt.

41. An apparatus for continuously forming thermoplastic products having precision microstructured surfaces, said apparatus comprising:
- a continuous double band press having an endless upper belt and an endless lower belt defining a substantially planar region therebetween through which the thermoplastic material travels;
- a reaction zone within the substantially planar region including an upstream heated section whereat the thermoplastic material is heated to its embossing temperature $T_e$ as pressure is applied and a downstream heated section whereat the thermoplastic material is cooled as pressure is applied;
- an overlay with a tool surface having inverse topography of the precision microstructured surface to be formed, the overlay traveling through the reaction zone with the thermoplastic material so that, in the upstream heated section, the tool surface precisely engages the thermoplastic material to emboss it with the precision microstructured surface; and
- tracking/steering rollers for keeping the overlay in alignment with the upper belt and/or the lower belt.

42. An apparatus as set forth in claim 41, wherein the overlay is attached to the upper belt.

43. An apparatus as set forth in claim 42, wherein the overlay is an overlay band which travels with the upper belt.

44. An apparatus as set forth in claim 41, wherein the overlay is attached to the lower belt.

45. An apparatus as set forth in claim 44, wherein the overlay is an overlay band which travels with the lower belt.

46. An apparatus as set forth in claim 41, further comprising a second overlay also having a tool surface with inverse topography of the precision microstructured pattern to be continuously formed, the inverse topography being sized to provide embossing depths of less than 1000 microns; and
- wherein the second overlay also travels through the reaction zone with the thermoplastic material so that, in the upstream heated section, the tool surface of the second overlay precisely engages the thermoplastic material to emboss it with the precision microstructured pattern.

47. An apparatus as set forth in claim 46, wherein the first overlay is attached to the upper belt and the second overlay is attached to the lower belt.

48. An apparatus as set forth in claim 47, wherein the first overlay is an overlay band which travels with the upper belt and the second overlay is an overlay band which travels with the lower belt.

* * * * *